(12) United States Patent
Seiler et al.

(10) Patent No.: US 10,659,852 B2
(45) Date of Patent: *May 19, 2020

(54) CONNECTOR ELEMENT INFORMATION DETECTIONS

(71) Applicant: Hewlett-Packard Development Company, L.P., Houston, TX (US)

(72) Inventors: Peter Andrew Seiler, Wellington, CO (US); Matt Jenkins, Fort Collins, CO (US); Amol Subhash Pandit, Fort Collins, CO (US); Heather Louise Volesky, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/174,588

(22) Filed: Oct. 30, 2018

(65) Prior Publication Data

US 2019/0075376 A1     Mar. 7, 2019

Related U.S. Application Data

(63) Continuation of application No. 15/544,975, filed on Jul. 20, 2017, now Pat. No. 10,136,197.

(51) Int. Cl.
*H04Q 1/20* (2006.01)
*H04L 25/02* (2006.01)
*H03K 19/0175* (2006.01)
*G06F 13/38* (2006.01)
(Continued)

(52) U.S. Cl.
CPC ............... *H04Q 1/20* (2013.01); *G06F 13/00* (2013.01); *G06F 13/38* (2013.01); *G06F 13/382* (2013.01); *G06F 13/385* (2013.01); *G06F 13/4081* (2013.01); *H03K 19/017545* (2013.01); *H04L 25/028* (2013.01); *H04L 25/0298* (2013.01); *H04Q 2201/802* (2013.01)

(58) Field of Classification Search
CPC ............... H04Q 1/20; H04Q 1/22; H04Q 1/24
See application file for complete search history.

(56) References Cited

U.S. PATENT DOCUMENTS

| | | | |
|---|---|---|---|
| 6,715,069 B1 | 3/2004 | Lucky | |
| 7,423,434 B2 * | 9/2008 | Stancil | G01R 31/045 324/539 |
| 7,488,206 B2 | 2/2009 | Caveney et al. | |

(Continued)

FOREIGN PATENT DOCUMENTS

| | | |
|---|---|---|
| EP | 2584468 | 4/2013 |
| GB | 2382891 A | 6/2003 |
| JP | 2005-295246 A | 10/2005 |

OTHER PUBLICATIONS

PCB ID and Authentication, Oct. 19, 2006, pp. 1-2, Maxim Integrated.

(Continued)

*Primary Examiner* — Andrew W Bee
(74) *Attorney, Agent, or Firm* — Wall & Tong LLP

(57) ABSTRACT

A device receives an analog voltage signal over a single physical electrical connection. The analog voltage signal can be converted into a digital value which can then be correlated to (i) an indication of a connection state of the primary device, and (ii) information about another device (or set of devices) which is connected to the device.

17 Claims, 2 Drawing Sheets

(51) Int. Cl.
*G06F 13/40* (2006.01)
*G06F 13/00* (2006.01)

(56) References Cited

U.S. PATENT DOCUMENTS

| | | | |
|---|---|---|---|
| 7,945,769 B2 | 5/2011 | Hong et al. | |
| 2003/0122672 A1 | 7/2003 | Billiard | |
| 2003/0161391 A1 | 8/2003 | Andre et al. | |
| 2004/0003224 A1* | 1/2004 | Rabe | G06F 9/4401 |
| | | | 713/1 |
| 2004/0018774 A1 | 1/2004 | Long et al. | |
| 2005/0268000 A1* | 12/2005 | Carlson | G06F 13/4081 |
| | | | 710/15 |
| 2008/0204289 A1 | 8/2008 | Miettinen | |
| 2008/0215765 A1* | 9/2008 | Butler | G06F 1/3203 |
| | | | 710/15 |
| 2009/0198841 A1* | 8/2009 | Yoshida | G06F 13/4295 |
| | | | 710/16 |
| 2010/0259399 A1* | 10/2010 | Tanno | G06F 13/4081 |
| | | | 340/635 |
| 2012/0051562 A1* | 3/2012 | Kim | H04R 3/00 |
| | | | 381/122 |
| 2013/0094559 A1 | 4/2013 | Buchner et al. | |
| 2013/0155258 A1* | 6/2013 | Wada | H04N 17/00 |
| | | | 348/189 |
| 2013/0275779 A1* | 10/2013 | He | G06F 1/26 |
| | | | 713/300 |
| 2014/0375419 A1* | 12/2014 | Cho | G06F 21/44 |
| | | | 340/5.8 |
| 2015/0039913 A1 | 2/2015 | Sugiyama et al. | |
| 2015/0248151 A1* | 9/2015 | Lim | G06F 1/266 |
| | | | 713/310 |

OTHER PUBLICATIONS

PCT Search Report/Written Opinion~Application No. PCT/US2015/028303 dated Jan. 25, 2016~ 10 pages.

* cited by examiner

CONNECTOR ELEMENT INFORMATION DETECTIONS

CROSS REFERENCE TO RELATED APPLICATIONS

This is a continuation of U.S. application Ser. No. 15/544,975, having a nation entry date of Jul. 20, 2017, which is a national stage application under 35 U.S.C. § 371 of PCT/US2015/028303, filed Apr. 29, 2015, which are both hereby incorporated by reference in their entirety.

BACKGROUND

Devices such as circuit boards rely on physical interconnectivity with other devices (e.g., module devices) for high-speed data transfer. As designs have become more complex the space and available connections of the connectors between such devices comes with a premium.

DETAILED DESCRIPTION

Figure 1:
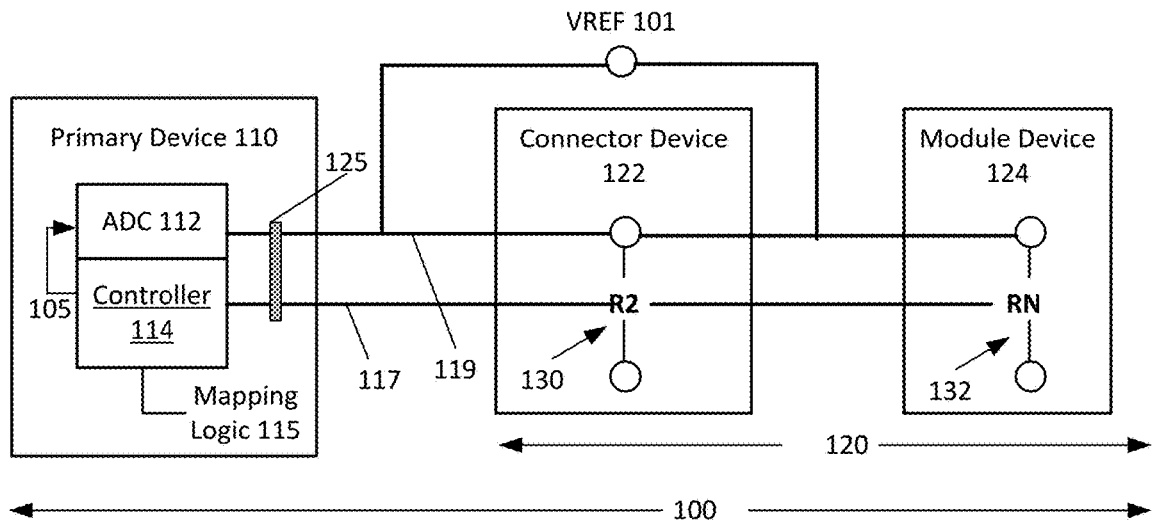
FIG. 1 illustrates an example assembly which includes a primary device connected to a set of connected devices, where the primary device uses a single physical connection line to determine connection state and/or information about one or more of the connected devices.

Existing practice uses multiple connector elements and/or communication protocols in order to convey information about connected devices to a controller or primary device. Under existing practice, the use of multiple connector elements to convey information about connected devices limits the number of connector elements which are otherwise available for other processes and functions (e.g., such as data transfer). To address these and other shortcomings, examples described herein enable single physical connection line of a primary or controller device to carry an analog voltage signal which conveys information pertaining to a connection state or a connected device. According to some examples, a circuit board device (e.g., primary device, module device) utilizes a single physical electrical contact (e.g., wire connection) to determine a connection state and/or information about a connected device.

Still further, some examples include a primary device that receives a purposed analog input signal over a single physical electrical connection. The analog signal can be converted into a digital value which can be correlated to (i) an indication of a connection state of the primary device, and (ii) information about another device (or set of devices) which is connected to the primary device. Among other benefits, the primary device detects a voltage characteristic provided on a single physical electrical connection (e.g., single wire connection) in order to determine whether other devices are connected to the primary device, as well as information about a connected device, such as an identifier of the connected device, a revision number or identifier, and/or a category or class of the connected device. By using a single electrical contact to communicate such information, examples as described preserve space and available connection lines on the primary device.

According to an aspect, a first (e.g., primary) device includes a set of multiple connector elements, an analog-to-digital converter, and logical resources. Each connector element of the set may be capable of receiving a physical electrical connection from a connector element of a second device when the second device is connected to the first device. The analog-to-digital converter converts an analog voltage signal received on a first connector element of the set to a digital value. The logic resources use the digital value to determine a connection state, from a plurality of connection states, of the first device. The logical resources determine preselected information of the second device, or of a third device that is connected to the first device via the second device. According to some examples, the first device can determine a connection state from a plurality of connection states. The plurality of connection states may include a first connection state in which the second device and the third device are not connected to the first device, a second connection state in which the second device is connected to the first device and the third device is not connected to the second device, and a third connection state in which the first device is connected to the second device and to the third device.

According to another example, a module device includes a set of multiple module connector elements, and a voltage divider network. Each module connector element of the module device receives a physical electrical connection from a connector element of a second device when the second device is mated to the module device. The set of voltage divider elements are provided to receive a voltage reference, and to generate a voltage output in analog form as output for a second device using only a first module connector element of the set. The voltage output can be generated by the set of voltage divider elements and the voltage reference. According to one aspect, the set of voltage divider are configured to generate the output voltage to correspond to a preselected value that is correlative to information about the module device.

In still another variation, a device assembly includes a primary device and a module device. The primary device is connected to the module device by multiple connection lines, including a detection line and a voltage reference line. The module device may include a voltage divider component to output an analog voltage signal on the detection line using a reference voltage of the voltage reference line. The voltage divider component may be structured or otherwise selected to correlate to preselected information of the module device. The primary device may include an analog-to-digital converter to convert the analog voltage signal on the detection line to a digital value, and logic resources to correlate the digital value to the preselected information of the module device.

According to another example, a device assembly includes a primary device, a connector device, and a module device. The primary device includes a set of multiple primary connector elements, including a first primary connector element to carry a voltage reference signal and a second primary connector element to receive a first analog voltage signal. The primary device may also include an A/D converter to convert an input signal received on a first connector element of the set to a digital value. The module device can include a set of multiple module connector elements, including a first module connector element to carry the voltage reference and a second module connector element to output a second analog voltage signal. The module device may also include a set of voltage divider elements which are configured to generate the second analog voltage signal to be a preselected value that is correlative to information about the module device. The connector device includes a primary connector set of multiple connector elements, including a first connector element to carry the voltage reference with the first primary connector element, and a second connector element to provide the second primary connector element the first analog voltage signal. The connector device may also include a module connector set of multiple connector elements, including a third connector element to carry the voltage reference with the first module connector element, and a fourth connector element to receive the second analog voltage signal from the second module connector element. When the primary device, connector device and module device are connected, the first analog voltage signal is based on the second analog voltage signal received from the second module connector element; and the primary devices uses the digital value to determine (i) one of multiple possible connection states of the multiple primary connector elements, and (ii) information about the module device.

FIG. 1 illustrates an example assembly which includes a primary device connected to a set of connected devices, where the primary device uses a single physical connection line to determine a connection state and/or information about one more of the connected devices. In an example of FIG. 1, the assembly 100 includes a primary device 110, and a set of one or more connected devices 120. The assembly 100 can include different types of devices, with the primary device 110 corresponding to a circuit board device, such as a main board or controller device. In an example of FIG. 1, the set of one or more connected devices 120 can include a connector device 122 that connects a module device 124 to the primary device 110. In one implementation, the primary device 110 corresponds to a printed circuit assembly (PCA) main board, and the module device 124 can correspond to a PCA module.

As described in greater detail, the primary device 110 uses a voltage signal on a single electrical line (shown as voltage detection line 117) of a connector interface 125 to determine (i) connection state and/or (ii) information about the connected module device. The connection state can identify whether, for example, the primary device 110 is (i) connected to any device at all, (ii) connected to a connector device, but not to a module device, or (iii) connected to one or more module devices (e.g., through a connector device). Additionally, the information about the module device 124 can include, for example, an identifier, a revision number or identifier, and/or a category or class designation of the module device 124. Other examples of information which can be determined about the module device 124 include rework identification, factory of origin, regulatory version, module version, power supply type, device capability indication, etc. The connection state and information about the connected devices 120 can be determined from a steady voltage value of the voltage detection line 117.

In an example of FIG. 1, the primary device 110 includes a controller 114 having an analog-to-digital (A/D) converter 112, and the connector interface 125. The connector interface 125 includes multiple connection lines, including the voltage detection line 117 and a voltage reference line 119.

The voltage reference line 119 can carry a steady or constant voltage reference 101, which is shared by the primary device 110, connector device 122 and module device 124. The connector device 122 and module device 124 can also include a voltage divider component 130, 132. In an example of FIG. 1, the voltage divider component 130, 132 of each connected device 120 can be implemented by one or more resistor elements (e.g., resistive elements provided in series or parallel) which combine with the voltage reference line 119 in order to create a steady voltage signal on the voltage detection line 117. The primary device 110 can detect the voltage signal of the voltage detection line 117, and the A/D converter 112 of the primary device 110 can detect the voltage signal and convert the voltage signal from analog form into a digital value. The controller 114 of the primary device 110 can include logic resources (shown as "mapping logic 115") to map the digital value, as determined by the A/D converter 112, into information that identifies the connection state of the primary device 110 and/or information about at least the module device 124. The voltage divider components 130, 132 of one or more of the connector device 122 and module device 124 can be pre-selected so that the voltage level of the voltage detection line 117 is correlated by the mapping logic 115 to reflect accurate information of the respective connector or module device. By way of example, the pre-selection of the voltage divider components 130, 132 can be through pre-selection of resistor values and arrangements (e.g., series and parallel). The module device 124 can include resistors arranged to divide the reference voltage of the voltage reference line 119. The resistors of the module device 124 can be selected by value and/or arrangement, with resistor values being of an order or more greater than resistors used for unconnected states, such as resistors for pull down (see FIG. 2A) to ground in the primary device 110, or resistors used as pull up (e.g., see FIG. 2B) for the voltage reference line of the connector device (e.g., see FIG. 2B).

Thus, examples provide that the primary device 110 can detect when it is disconnected from the connector device 122 and/or module device 124, based on the voltage level on the voltage detection line 117. In some implementations, the primary device 110 can detect when it is disconnected from both the connector device 122 and the module device 124, or when the primary device 110 is connected to the connector device 122 but not the module device 124.

Still further, any one of multiple different kinds of connected devices can be connected to the primary device 110, either directly or via a connector device. The voltage level of the voltage detection line 117 can also be indicative of information about the module device 124, such as the identifier, revision number, category or class of one or both of the connected devices 120.

Thus, among other benefits, an example of FIG. 1 can structure a single wire connection to enable detection of both a connection state and information about the connected auxiliary devices. For example, the voltage divider component 132 of the module device 124 can signify through the voltage level of the voltage detection line 117, the particular revision of a PCA module (e.g., Rev. A, Rev. B etc.) which is attached to the PCA controller. A different set of values can signify different possible connection states when no PCA module is connected (e.g., connector device without PCA module, no connected device, etc.). Table 1 below reflects an example of the mapping logic 115 correlating a value of the voltage detection line 117 to a particular meaning, such as connection state or information about the PCA module.

TABLE 1

| Analog Voltage | Information On Mod. Device | Connection Status |
|---|---|---|
| $V_{ref}$ | | Cable Only Detected |
| $V_{ref} - n$ | Rev Y | Modular Device Connected |
| $V_{ref} - 2n$ | Rev X | Modular Device Connected |
| — | — | Modular Device Connected |
| $V_{ref} - Xn$ | Rev A | Modular Device Connected |
| 0 | | Cable/Device Not Saved |

As shown by an example of Table 1, the digital value 105 can correlate to a connection state when no cable device is connected when the voltage level on the detection line 117 is less than a designated threshold (e.g., approximately 0). When the voltage level of the detection line 117 is above a high threshold (e.g., approximately the reference voltage), the connection state can correspond to one in which the connector device 122 is connected but not the module device 124. Still further, an intermediate value for the voltage level of the detection line (e.g., between the high and low thresholds) can correlate to a connection state in which the module device 124 is connected, and furthermore identify preselected information about the connected module device 124 (e.g., revision identifier).

Figure 2A:
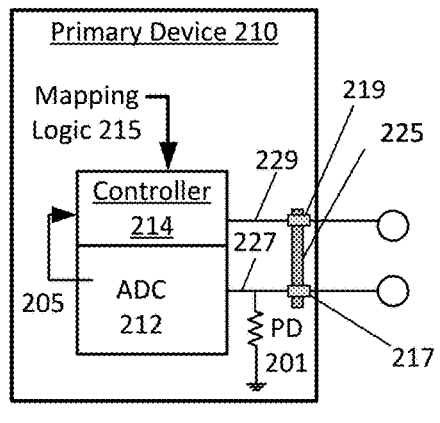
FIG. 2A through FIG. 2C illustrate an example of a primary device in different connection states with respect to a connector device and/or a module device.
Figure 2B:
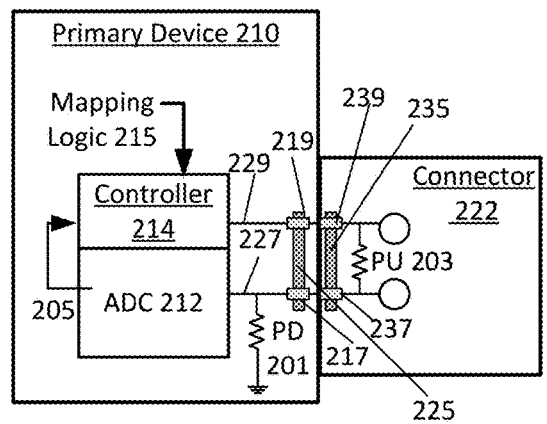
Figure 2C:
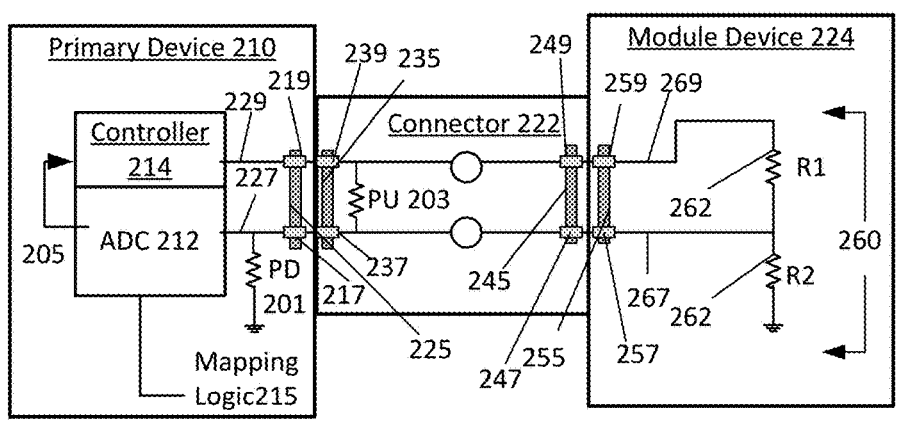

FIG. 2A through FIG. 2C illustrate an example of a primary device in difference connection states with respect to a connector device and/or a module device. In an example of FIG. 2A, a primary device (e.g., PCA main board) can correspond to a primary device 110 of an assembly such as described with FIG. 1. In an example of FIG. 2, the primary device 210 includes an A/D converter 212, a controller 214, and a connector interface 225 to connect with other devices. The connector interface 225 can include a plurality of connection elements for forming connection lines with other devices. The plurality of connection elements can include a voltage reference contact element 219 for extending a voltage reference connection 229 with any device connected to the primary device 210 via the connector interface 225. The plurality of connection elements can also include a detection contact element 217 for forming a voltage detection line 227 for the A/D converter 212 on which an analog voltage signal can be carried. As described with other examples, the analog voltage signal can be indicative of information about connection state and of the interconnected devices.

In some examples, the primary device 210 can include mapping logic 215 which maps a digital value, converted from an analog voltage signal on the voltage detection line 227, to information which can indicate both the connection state of the primary device 210 and information about one or more devices connected to the primary device 210. In example of FIG. 2A, the analog voltage signal can indicate one of multiple possible connection states that reflects the primary device 210 as being in a stand-alone state, at least with respect to the connector interface 225. In the stand-alone state, the voltage value on the voltage detection line 227 can reflect a digital value that correlates to an indication of the stand-alone state. For example, in one implementation, the voltage value of the detection line 227 can correspond to approximately zero voltage, which the mapping logic 215 can automatically associate to the stand-alone state. In one implementation, a pull-down resistor 201 and ground can be positioned on an inlet portion of the detection line 227 to generate a zero or lowest voltage value for the A/D converter 212 in absence of another device being connected to the primary device 210. In one example, the value of the pull down resistor 201 can be selected to reflect an input value for the A/D converter 212. The controller 214 can use the digital value 205 as input against the mapping logic 215, such as to determine that no connector device 222 or module device 224 is connected to the primary device 210, as shown by an example of FIG. 2A.

In an example of FIG. 2B, the primary device 210 can be connected to a connector device 222, which can correspond to the connector device 122 of an example of FIG. 1. The connector device 222 can include a primary device-facing connector interface 235 which mates with the connector interface 225 of the primary device 210 to extend connection lines between the two devices. The connection lines that are formed can include extending the detection line 227 and the voltage reference line 229 to corresponding primary (device-facing) connector elements 237, 239 of the connector interface 235 for the connector device 222.

The A/D converter 212 can convert the analog signal of the detection line 227 to a digital value 205 which reflects the connection state of the primary device 210 (connector device connected without module device 224). According to one implementation, the connector device 222 uses a resistive line (e.g., as provided by a pull up resistor 203) between the reference line 229 and the detection line 227 as a voltage divider component to affect the detected input voltage. The inclusion of the pull up resistor 203, for example, raises the voltage on the voltage detection line 227 of the primary device 210 to a measured value, which can be indicative of the connector device 222 being connected without the module device 224. The pull up resistor 203 shown in the example of FIG. 2B can be selected to be relatively weak as compared to the resistors of the voltage divider components, but strong enough to overcome the pulldown resistor 201 of the primary device 210. With the pull up resistor 203, the voltage detection line 227 can carry an analog voltage signal which the A/D converter 212 can convert into the digital value 205. The controller 214 can use the mapping logic 215 to map the digital value 205 to information that indicates the connector device 222 is connected to the primary device 210 without another module device being connected to the connector device.

In an example of FIG. 2C, the primary device 210 is shown connected to a connector device 222 and a module device 224. The module device 224 can correspond to the module device 124 of an example of FIG. 1. The connector interface 245 of the connector device 222 can include module-facing contact elements ("module contact elements"), including a detection module contact element 247 and reference voltage module contact element 249. Likewise, the connector interface 255 of the module device 224 includes contact elements 257, 259 which individually mate with corresponding module contact elements 247, 249 of the connector device 222. The resulting connections formed by the module device 224 and the connector device 222 result in the extension of detection line 267 and voltage reference line 269 from the respective detection line 227 and voltage reference line 229 of the primary device 210.

The module device 224 can include a voltage divider component 260 which receives the steady voltage reference, as received or provided by the primary device 210. The voltage divider component 260 can be formed from, for example, a combination of resistors 262 which are provided in series and/or in parallel. The resistors (or other elements) of the voltage divider component 260 can be selected by resistive value and/or arrangement to generate a given voltage output, based on the reference voltage of the voltage reference line 259. In some variations, the voltage divider component 260 is pre-selected to generate the desired voltage output, which is output on the detection line 267 and received by the A/D converter 212 via the voltage detection line 227.

The voltage divider component 260 can be pre-selected (e.g., through selection of resistor values and/or arrangement in series/parallel) to generate a steady analog signal of a predetermined value which maps to a particular characteristic, attribute or property of the module device 224. In this way, the voltage divider component 260 can be purposefully selected, in connection with a known or pre-selected reference voltage, to generate the desired steady analog signal. The A/D converter 212 of the primary device 210 can convert the analog signal produced from the voltage divider component 260 of the primary device 224 into a digital value 205, which can then be referenced against the mapping logic 215 to determine information about the module device 224. By way of example, the information determined from the module device 224 can include an identifier, revision number or identifier, or a class or category of the module device 224.

While examples described with FIG. 1 and FIG. 2A through 2C illustrate a 1:1 system, variations provide that the controller 114, 214 can include multiple inputs for the A/D converter 112, 212. The PCA module 124, 224 can include multiple voltage divider components 132, 260 for N components, each of which can be provided as input to the A/D converter through a corresponding voltage detection line 117, 227.

Figures 3A, 3B:
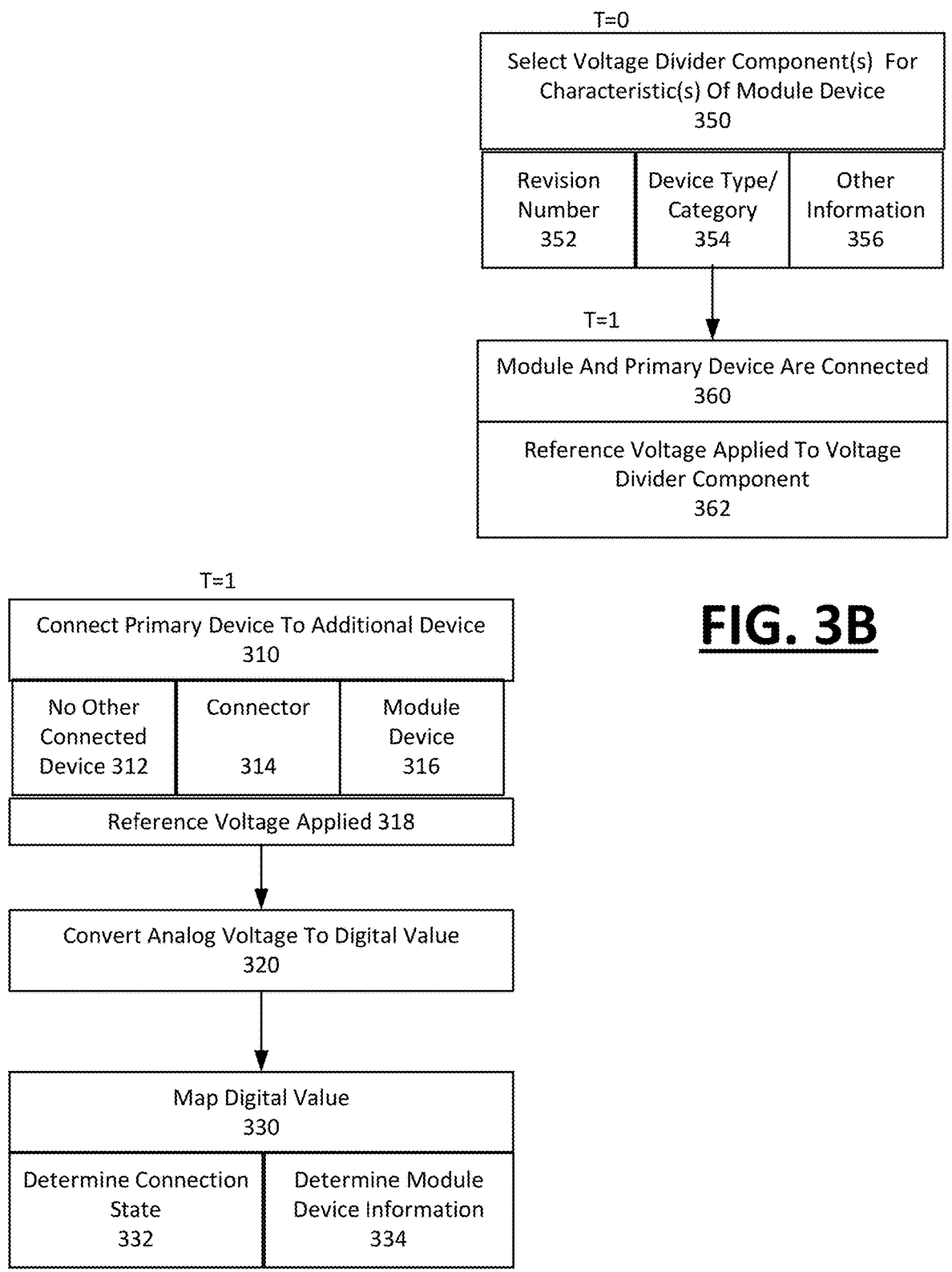
FIG. 3A illustrates an example method for utilizing a primary device to determine a connection state and/or information about a connected device using a single connection line as input.
FIG. 3B illustrates an example method for configuring a module device to enable a connected primary device to detect information about the connected device using a single connection line as input.

FIG. 3A illustrates an example method for utilizing a primary device to determine a connection state and/or information about a connected auxiliary device using a single connection line as input. FIG. 3B illustrates an example method for configuring a module device to enable a connected primary device to detect information about the connected device using a single connection line as input. In describing an example method of FIG. 3A or FIG. 38, reference may be made to elements of FIG. 1 or FIG. 2A through FIG. 2C for purpose of illustrating a suitable component or element for performing a function or operation as described. Furthermore, in describing an example of FIG. 3A and FIG. 3B, reference may be made to a common timeline in order to illustrate one example of an order of operation as between the primary device and the module device.

With reference to an example of FIG. 3A, a primary device 110 can be connected to one or more connected devices 120 (310, Time Period T=1). The devices connected to the primary device 110 can include no other connected device (312), the connector device 122 without another connected device (314), and/or the module device 124 (316). Each connected device may share (or receive) a steady voltage reference line (318). By using the same steady voltage reference line, negative effects from fluctuations in the voltage reference line can be mitigated or avoided.

The primary device 110 can receive an analog voltage signal over a single detection line which is formed by the connection of the connector device 122 and/or module device 124 (320). The primary device 110 can include the A/D converter 112 with the controller 114 in order to convert the analog voltage signal on, for example, the voltage detection line 117 to a digital value 105 (322).

The primary device 110 can use the mapping logic 115 to map the digital value 105 to information about the use of the primary device with respect to connections with other devices (330). In particular, the primary device 110 can use the mapping logic 115 to determine (i) one of multiple possible detection states of the primary device 110 (332) and (ii) information about the module device 124 which is connected through the connector device 122 (334). The information can include, for example, an identifier of the module device 124, revision number or identifier for the module device 124, and/or a class or category of the module device 124. Other examples of information which can be determined about the module device 124 include rework identification, factory of origin, regulatory version, module version, power supply type, device capability indication, etc. The amount and type of information, as well as the number of information items which can be communicated through use of the analog voltage signal on the voltage detection line 117 (or 227 in FIG. 2A-2C) can vary and be selected by design and implementation. With a sufficient reference voltage and/or tuned A/D converter 112, the amount, type and number of information items carried by the analog voltage signal on the detection line 227 can be selected and varied.

With reference to an example of FIG. 3B, the module device 124 can include a voltage divider component or network which is purposefully selected to correlate to information that indicates an information item of interest about the module device 124 (350. Time Period T=0). In one example, one or more voltage divider components 132 can be configured based on resistor values and arrangement to create a desired voltage division effect on the reference voltage which is shared with the primary device 110. The information can include, for example, a revision identifier or number (352), a device type or category (354) or other information (356) (e.g., an identifier of the module device 124).

The module device 124 and the primary device 110 can be connected (360, Time Period=1). In one implementation, the module device 124 is connected to the primary device 110 via the connector device 122. In variations, the module device 124 is connected directly to the primary device 110. When the module device 124 and the primary device 110 are connected, the voltage divider component(s) of the module device 124 are used to output an analog voltage signal on the connected detection line, which the primary device 110 can interpret (as described with an example of FIG. 3A) (362).

Although illustrative embodiments have been described in detail herein with reference to the accompanying drawings, variations to specific embodiments and details are encompassed by this disclosure. It is intended that the scope of embodiments described herein be defined by claims and their equivalents. Furthermore, it is contemplated that a particular feature described, either individually or as part of an embodiment, can be combined with other individually described features, or parts of other embodiments. Thus, absence of describing combinations should not preclude the inventor(s) from claiming rights to such combinations.

What is claimed is:

1. A first device, comprising:
    a connector element to receive a physical electrical connection from a respective connector element of a second device if the second device is connected to the first device;
    an analog-to-digital converter to convert an analog voltage signal received on the connector element to a digital value; and
    logic resources to process the digital value to determine (i) a connection state, from a plurality of connection states for the connector element and (ii) preselected information of the second device, the preselected information including a revision identifier of the second device and a category of the second device.

2. The first device of claim 1, wherein a third device is to connect to the first device via the second device, and wherein the logic resources are to process the digital value to determine (i) the connection state, or (ii) preselected information of the third device.

3. The first device of claim 2, wherein the preselected information of the third device includes one of an identifier of the third device, a revision identifier of the third device, or a category of the third device.

4. The first device of claim 2, wherein the connection state is one of a plurality of connection states, including:
a first connection state in which the third device and the second device are not connected to the first device;
a second connection state in which the second device is connected to the first device and the third device is not connected to the second device; and
a third connection state in which the first device is connected to the second device and the third device.

5. The first device of claim 4, wherein the determined connection state is based on a comparison of the digital value and a reference voltage.

6. A module device, comprising:
a module connector element to receive a physical electrical connection from a primary connector element of a primary device if the primary device is connected to the module device; and
a voltage divider component to receive a voltage reference and to provide an analog voltage signal on a voltage detection line using the module connector element, wherein the voltage divider component is to generate the analog voltage signal to correspond to a preselected value that is correlative to a revision identifier of the module device and a category of the module device.

7. The module device of claim 6, wherein the module connector element is a first module connector element of a set of multiple module connector elements, the first module connector element to carry the voltage reference.

8. The module device of claim 7, wherein the set of multiple connector elements includes a second module connector element to output the analog voltage signal on the voltage detection line.

9. The module device of claim 6, wherein the voltage divider component is part of a set of voltage divider components, the set of voltage divider elements to generate the analog voltage signal.

10. A device assembly, comprising:
a first device connected to a second device by a voltage detection line, the first device comprising:
an analog-to-digital converter to convert an analog voltage signal of the voltage detection line to a digital value; and
logic resources to correlate the digital value to a preselected information of the second device;
wherein the second device comprises:
a voltage divider component to output the analog voltage signal on the voltage detection line using a reference voltage, the voltage divider component being preselected to correlate to the preselected information of the second device, and
wherein the preselected information includes a revision identifier of the second device and a category of the second device.

11. The device assembly of claim 10, wherein the first device is further connected to the second device by a voltage reference line and the reference voltage is a reference voltage of the voltage reference line.

12. The device assembly of claim 10, wherein the logic resources further correlate the digital value to a connection state of the second device.

13. The device assembly of claim 12, further comprising a connector device to connect the first device to the second device.

14. The device assembly of claim 13, wherein the connector device is to output an analog voltage signal on the voltage detection line using the reference voltage if the second device is not connected to the connector device.

15. The device assembly of claim 14, wherein the connection state is one of a plurality of connection states, including:
a first connection state in which the second device and the connector device are not connected to the first device;
a second connection state in which the connector device is connected to the first device and the second device is not connected to the connector device; and
a third connection state in which the first device is connected to the connector device and the second device.

16. The device assembly of claim 15, wherein the digital value is less than a first threshold value if the connection state is the first connection state, the digital value is greater than a second threshold value when the connection state is the second connection state, and the digital value is an intermediate value that is between the first threshold value and the second threshold value when the connection state is the third connection state.

17. The device assembly of claim 15, wherein the determined connection state is based on a comparison of the digital value and the reference voltage.

* * * * *